United States Patent
Furukawa et al.

(10) Patent No.: US 7,229,909 B2
(45) Date of Patent: Jun. 12, 2007

(54) INTEGRATED CIRCUIT CHIP UTILIZING DIELECTRIC LAYER HAVING ORIENTED CYLINDRICAL VOIDS FORMED FROM CARBON NANOTUBES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 11/008,800

(22) Filed: Dec. 9, 2004

(65) Prior Publication Data

US 2006/0128137 A1    Jun. 15, 2006

(51) Int. Cl.
*H01L 21/00* (2006.01)
(52) U.S. Cl. .............. 438/622; 438/618; 438/637; 438/672; 977/742; 977/842
(58) Field of Classification Search ........ 438/618–622, 438/637–638, 672–673
See application file for complete search history.

(56) References Cited

U.S. PATENT DOCUMENTS

| | | |
|---|---|---|
| 2002/0055256 A1 | 5/2002 | Jiang |
| 2004/0058153 A1 | 3/2004 | Ren |
| 2004/0169281 A1 | 9/2004 | Nguyen et al. |
| 2005/0168131 A1* | 8/2005 | DiSanto et al. ............. 313/497 |
| 2005/0196950 A1* | 9/2005 | Steinhogl et al. ........... 438/622 |
| 2005/0215049 A1* | 9/2005 | Horibe et al. ............... 438/622 |

FOREIGN PATENT DOCUMENTS

WO    WO 03/050868 A2    6/2003

OTHER PUBLICATIONS

D. Kim et al., "The growth of freestanding single carbon nanotube arrays," Nanotechnology 14, 1269-1271 (Institute of Physics Publishing, 2003).
K. Kempa et al., "Photonic Crystals Based on Periodic Arrays of Aligned Carbon Nanotubes," Nanoletters 2003, vol. 12, No. 1, 13-18 (American Chemical Society, 2003).

(Continued)

*Primary Examiner*—Dung A. Le
(74) *Attorney, Agent, or Firm*—Roy W. Truelson

(57) ABSTRACT

A dielectric in an integrated circuit is formed by creating oriented cylindrical voids in a conventional dielectric material. Preferably, voids are formed by first forming multiple relatively long, thin carbon nanotubes perpendicular to a surface of an integrated circuit wafer, by depositing a conventional dielectric on the surface to fill the area between the carbon nanotubes, and by then removing the carbon nanotubes to produce voids in place of the carbon nanotubes. A layer of dielectric and voids thus formed can be patterned or otherwise processed using any of various conventional processes. The use of a conventional dielectric material having numerous air voids substantially reduces the dielectric constant, leaving a dielectric structure which is both structurally strong and can be constructed compatibly with conventional processes and materials.

23 Claims, 12 Drawing Sheets

OTHER PUBLICATIONS

J. Wen et al., "Growth and characterization of aligned carbon nanotubes from patterned nickel nanodots and uniform thin films," J. Mater. Res. vol. 16, No. 11, 3246-53 (Nov. 2001).

Z. F. Ren et al., "Large Arrays of Well-Aligned Carbon Nanotubes," Proceedings of 13th Int'l Winter School on Electronic Properties of Novel Materials, pp. 263-267 (Feb. 27-Mar. 6, 1999).

C. Kiang, "Growth of Large-diameter Single-Walled Carbon Nanotubes", J. Phys. Chem A, vol. 104, No. 11, 2454-56 (American Chemical Society 2000).

J. Li, et al., "Electronic properties of multiwalled carbon nanotubes in an embedded vertical array", Applied Physicas Letters, vol. 81, No. 5 (American Inst. of Physics 2002).

B. Wei, et al., "Organized assembly of carbon nanotubes", Nature, vol. 416 (Apr. 2002).

H. W. Zhu, et al., "Direct Synthesis of Long Single-Walled Carbon Nanotube Strands", Science vol. 296, pp. 884-886 (May 2002).

M. Meyyappan, et al., "Carbon Nanotubes", published on the world wide web at http://www.microelectronics.scu.edu/nanotechnology, date unknown.

S.K. Klador, "Ability to Control Configuration and Length of Nanotubes Demonstrated", MRS Bulletin (Jun. 2002).

Y. Yu et al., "Growth of Aligned Carbon Nanotubes with Controlled Site Density," Applied Physics Letters, AIP, American Institute of Physics, Melville, NY, vol. 80, No. 21, May 27, 2002.

Z. P. Huang et al., "Growth of Large Periodic Arrays of Carbon Nanotubes," Applied Physics Letters, AIP, American Institute of Physics, Melville, NY, vol. 82, No. 3, Jan. 20, 2003.

* cited by examiner

INTEGRATED CIRCUIT CHIP UTILIZING DIELECTRIC LAYER HAVING ORIENTED CYLINDRICAL VOIDS FORMED FROM CARBON NANOTUBES

FIELD OF THE INVENTION

The present invention relates to digital data processing, and in particular to the design of integrated circuit chips used as components of digital data systems.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems become faster, store more data, and provide more applications to their users.

A modern computer system typically comprises a central processing unit (CPU) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

The overall speed of a computer system (also called the throughput) may be crudely measured as the number of operations performed per unit of time. There are numerous ways in which system speed might be improved, but conceptually the simplest and most fundamental of all improvements is to increase the speed at which the basic circuits operate, i.e., to increase the clock speeds of the various components, and particularly the clock speed of the processor(s). E.g., if everything runs twice as fast but otherwise works in exactly the same manner, the system will perform a given task in half the time.

Clock speeds are necessarily limited by various design parameters, and in particular are limited by signal propagation delays. In general, clock speeds can be increased if the length of signal paths is reduced, i.e., by shrinking the size of the logic elements. Early computer processors, which were constructed from many discrete components, were susceptible to significant speed improvements by shrinking component size, reducing discrete component numbers, and eventually, packaging the entire processor as an integrated circuit on a single chip. Modern processor chip designs often include one or more caches on the same integrated circuit chip as the processor, and in some cases include multiple processors on a single integrated circuit chip.

Despite the enormous improvement in speed obtained from integrated circuitry, the demand for ever faster computer systems has continued. With this demand comes a need for even further size reduction in the logic circuitry within an integrated circuit chip.

A typical integrated circuit chip is constructed in multiple layers. Many active and passive elements are formed on a substrate (usually silicon). A dielectric layer is placed over the elements, and multiple conductive layers, each separated by another dielectric layer, are formed over the elements. The conductive layers carry power and ground potentials, as well as numerous signal interconnects running among active elements. Each conductive layer comprises multiple discrete conductors, often running substantially in parallel. Conductive interconnects between conductive layers, or between a conductive layer and an active or passive element, are formed as holes in the dielectric layers, called vias, into which a conductive metal, such as aluminum or copper, is introduced.

The number of active elements in a typical processor dictates a very large number of interconnections. A large number of relatively long, narrow conductors introduces some degree of parasitic capacitance in the integrated circuit, which varies with the individual conductors. As the number of such conductors increases and as processor clock speeds also increase, this parasitic capacitance becomes a significant problem for the designer. I.e., it becomes increasingly difficult to assure that all required signals will propagate the full length of their conductors and cause any required state change in an element at the opposite end within the available clock cycle time.

The problem of parasitic capacitance has long been known by integrated circuit designers, and numerous design approaches have been used to counter its effects. For example, integrated circuits are laid out in such a manner as to reduce signal path lengths. Signal wires are laid out to avoid running wires for long distances next to each other in adjacent conductive layers. Intentional delays are sometimes introduced into certain paths to balance inherent delays of other paths. In some cases, long signal paths are split by clocking a signal into a latch, so that the signal requires multiple cycles to propagate.

One of the fundamental physical parameters influencing the amount of capacitance in signal paths is the dielectric constant (k) of the dielectric material separating conductors. Ideally, the dielectric constant is as low as possible to reduce the amount of capacitance. However, it is not possible to simply select any arbitrary low-k material as a dielectric. Any material selected must provide suitable performance in numerous, demanding ways. For example, it must tolerate high temperatures of numerous processing steps, be extremely stable in operation, be compatible with other materials used as conductors and semiconductors, etc.

Silica or silicon oxide or silicon dioxide ($SiO_2$) has traditionally been the dielectric of choice, and modern semiconductor fabrication techniques have evolved as suitable for use with a silicon oxide dielectric. Silicon oxide has a dielectric constant in the high 3's to 4 range. Various alternative materials (having lower dielectric constants) have been proposed and/or have been the subject of investigation for use in integrated circuits. However, all such materials have their respective drawbacks, such as compatibility with existing processes or semiconductor materials.

No single dielectric material has emerged as a clearly superior alternative to conventional silicon oxide.

If a suitable dielectric could be found which both has substantially lower dielectric constant than conventional silicon oxide or similar materials, and is generally suitable as a substitute for silicon oxide, the parasitic capacitance of integrated circuits could be substantially reduced without any other design changes. Such a reduction would enable further clock speed enhancements and/or density of elements within an integrated circuit chip. A need therefore exists for an improved dielectric for use in integrated circuitry.

SUMMARY OF THE INVENTION

A dielectric structure (preferably as a layer of an integrated circuit chip) is formed by creating oriented cylindrical voids in a conventional dielectric material, such as silicon oxide. The voids reduce the dielectric constant of the composite structure below that of a conventional solid dielectric.

In the preferred embodiment, voids are formed by first forming multiple relatively long, thin carbon nanotubes on a surface of an integrated circuit wafer, by depositing a conventional dielectric (such as silicon oxide) on the surface to fill the area between the carbon nanotubes, and by then removing the carbon nanotubes to produce voids in the locations formerly occupied by the carbon nanotubes. A layer of dielectric and voids thus formed can be patterned or otherwise processed using any of various conventional processes for dielectric material.

In the preferred embodiment, a random pattern of nickel particles is formed as a catalyst on a surface of the wafer. Carbon nanotubes are grown from the nickel catalyst, oriented substantially perpendicular to the surface. A dielectric is then deposited on the surface, covering the carbon nanotubes and the area between the carbon nanotubes. The wafer is then polished to expose the tips of the carbon nanotubes and to establish a desired thickness of dielectric. The carbon nanotubes in the dielectric can then be removed by ashing with ozone or oxygen plasma to leave voids in the dielectric structure. Various additional process steps, some of which may be optional, are further described herein.

A layer of dielectric structure having voids therein can be used either as an insulative layer between two conductive layers in an integrated circuit, or as the insulative material within a conductive layer which isolates multiple discrete conductors in the conductive layer. In any of the various preferred embodiments, the dielectric structure including voids is suitably patterned by any conventional process to form multiple conductive paths and/or vias. Patterning may be performed either before or after the carbon nanotubes are removed.

The use of a conventional dielectric material having numerous air voids, as described herein, provides a relatively low-k dielectric. Furthermore, because the material is conventional (e.g., silicon oxide), any of various conventional processes can be used for depositing, polishing, patterning, etching, or otherwise manufacturing the integrated circuit wafer. Carbon nanotubes can be grown very thin and elongated, in a dense pattern. Unlike certain previous attempts to introduce air voids into a dielectric material, the use of carbon nanotubes produces oriented cylindrical voids of sufficient number to substantially reduce the dielectric constant of the resultant structure, leaving a dielectric layer which is both structurally strong and can be constructed compatibly with conventional processes and with other structures in the integrated circuit.

The details of the present invention, both as to its structure and operation, can best be understood in reference to the accompanying drawings, in which like reference numerals refer to like parts, and in which:

DETAILED DESCRIPTION OF THE PREFERRED EMBODIMENTS

Figure 1:
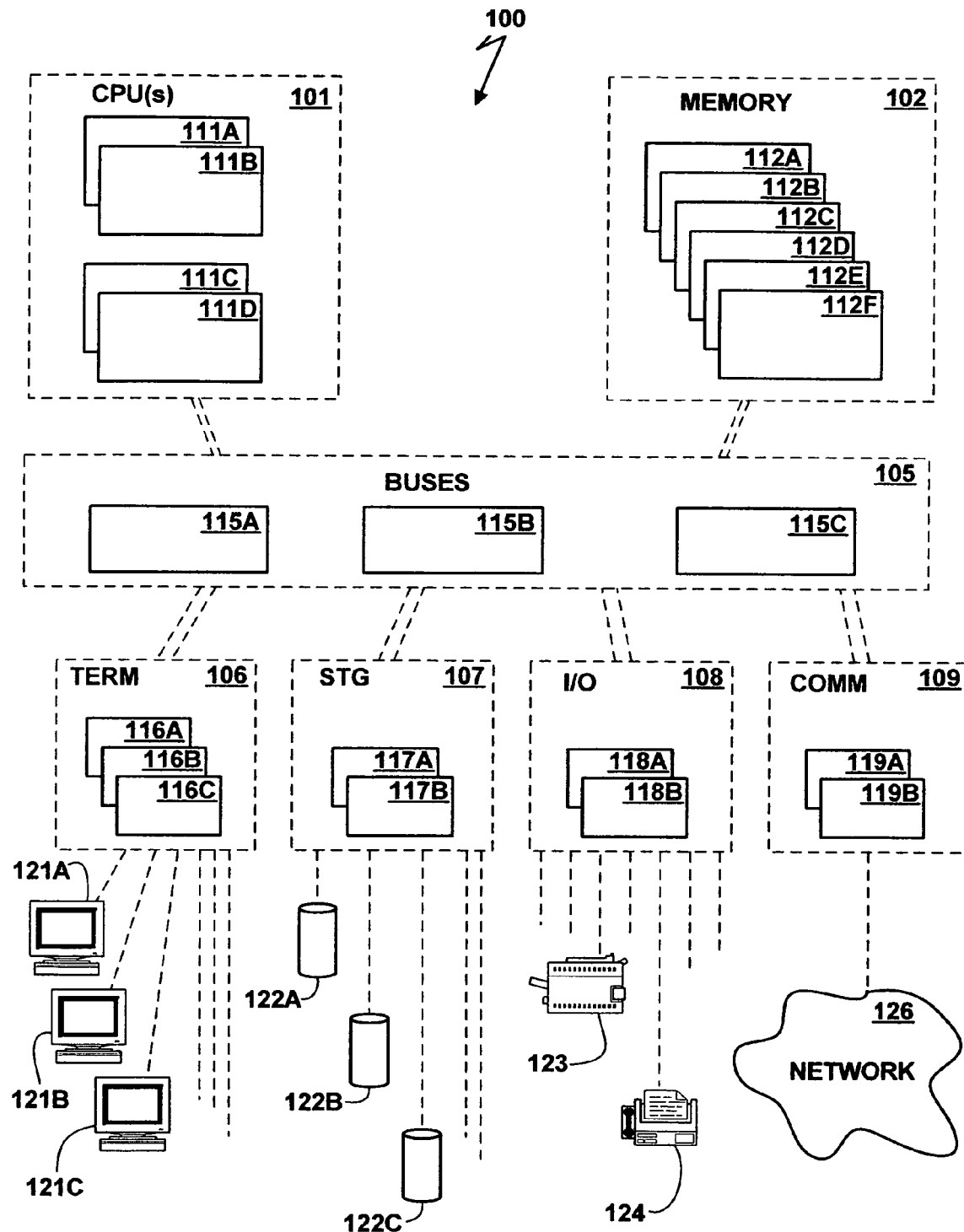
FIG. 1 is a high-level block diagram of the major hardware components of a computer system for utilizing integrated circuits having dielectric layer structures with voids formed from carbon nanotubes, according to the preferred embodiment of the present invention.

Referring to the Drawing, wherein like numbers denote like parts throughout the several views, FIG. 1 is a high-level representation of the major hardware components of a computer system 100 for utilizing integrated circuits having carbon nanotube conductors, according to the preferred embodiment of the present invention. At a functional level, the major components of system 100 are shown in FIG. 1 outlined in dashed lines; these components include one or more central processing units (CPU) 101, main memory 102, terminal interface 106, storage interface 107, I/O device interface 108, and communications/network interfaces 109, all of which are coupled for inter-component communication via one or more buses 105.

CPU 101 is one or more general-purpose programmable processors, executing instructions stored in memory 102; system 100 may contain either a single CPU or multiple CPUs, either alternative being collectively represented by feature CPU 101 in FIG. 1, and may include one or more levels of on-board cache (not shown). Memory 102 is a random-access semiconductor memory for storing data and programs. Memory 102 is conceptually a single monolithic entity, it being understood that memory is often arranged in a hierarchy of caches and other memory devices. Additionally, memory 102 may be divided into portions associated with particular CPUs or sets of CPUs and particular buses, as in any of various so-called non-uniform memory access (NUMA) computer system architectures.

Terminal interface 106 provides a connection for the attachment of one or more user terminals 121A–C (referred to generally as 121), and may be implemented in a variety of ways. Many large server computer systems (mainframes) support the direct attachment of multiple terminals through terminal interface I/O processors, usually on one or more electronic circuit cards. Alternatively, interface 106 may provide a connection to a local area network to which terminals 121 are attached. Various other alternatives are possible. Data storage interface 107 provides an interface to one or more data storage devices 122A–C, (referred to generally as 122), which are typically rotating magnetic hard disk drive units, although other types of data storage device could be used. I/O and other device interface 108 provides an interface to any of various other input/output devices or devices of other types. Two such devices, printer 123 and fax machine 124, are shown in the exemplary embodiment of FIG. 1, it being understood that many other such devices may exist, which may be of differing types. Communications interface 109 provides one or more communications paths from system 100 to other digital devices and computer systems; such paths may include, e.g., one or more networks 126 such as the Internet, local area networks, or other networks, or may include remote device communication lines, wireless connections, and so forth.

Buses 105 provide communication paths among the various system components. Although a single conceptual bus entity 105 is represented in FIG. 1, it will be understood that a typical computer system may have multiple buses, often arranged in a complex topology, such as point-to-point links in hierarchical, star or web configurations, multiple hierarchical busses, parallel and redundant paths, etc., and that separate buses may exist for communicating certain information, such as addresses or status information.

Physically, the major functional units are typically embodied in one or more integrated circuit chips. Such chips are generally mounted on electronic circuit card assemblies, with multiple chips often mounted on a single circuit card. In FIG. 1, CPU 101 is represented as containing four integrated circuit chips 111A–D, each of which may contain one or more processors, or may perform only part of the functions of a single processor; memory 102 is represented as containing six chips 112A–112F, buses 105 as containing three chips 115A–C, terminal interface 106 as containing three chips 116A–116C, storage interface 107 as containing two chips 117A–B, I/O and other interface 108 as containing two chips 118A–B, and communications interface 109 as containing two chips 119A–B. However, the actual number of such chips may vary.

It should be understood that FIG. 1 is intended to depict the representative major components of an exemplary system 100 at a high level, that individual components may have greater complexity than represented FIG. 1, and that the number, type and configuration of such functional units and physical units may vary considerably. It will further be understood that not all components shown in FIG. 1 may be present in a particular computer system, and that other components in addition to those shown may be present. Although system 100 is depicted as a multiple user system having multiple terminals, system 100 could alternatively be a single-user system, typically containing only a single user display and keyboard input, or might be a server or similar device which has little or no direct user interface, but receives requests from other computer systems (clients).

Figure 2:
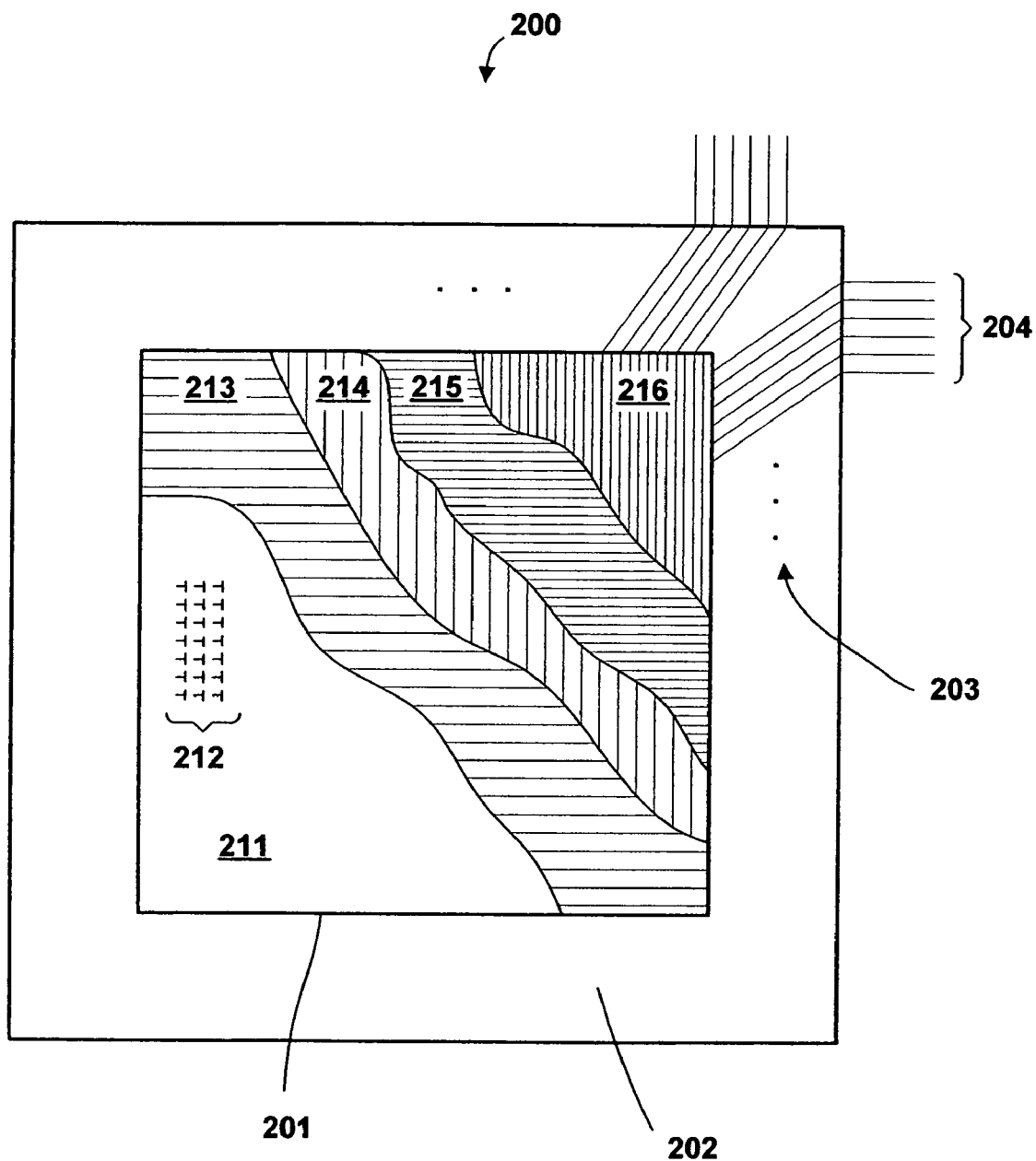
FIG. 2 is a simplified illustration of an integrated circuit module in cut-away, top view representation, according to the preferred embodiment.
Figure 3:
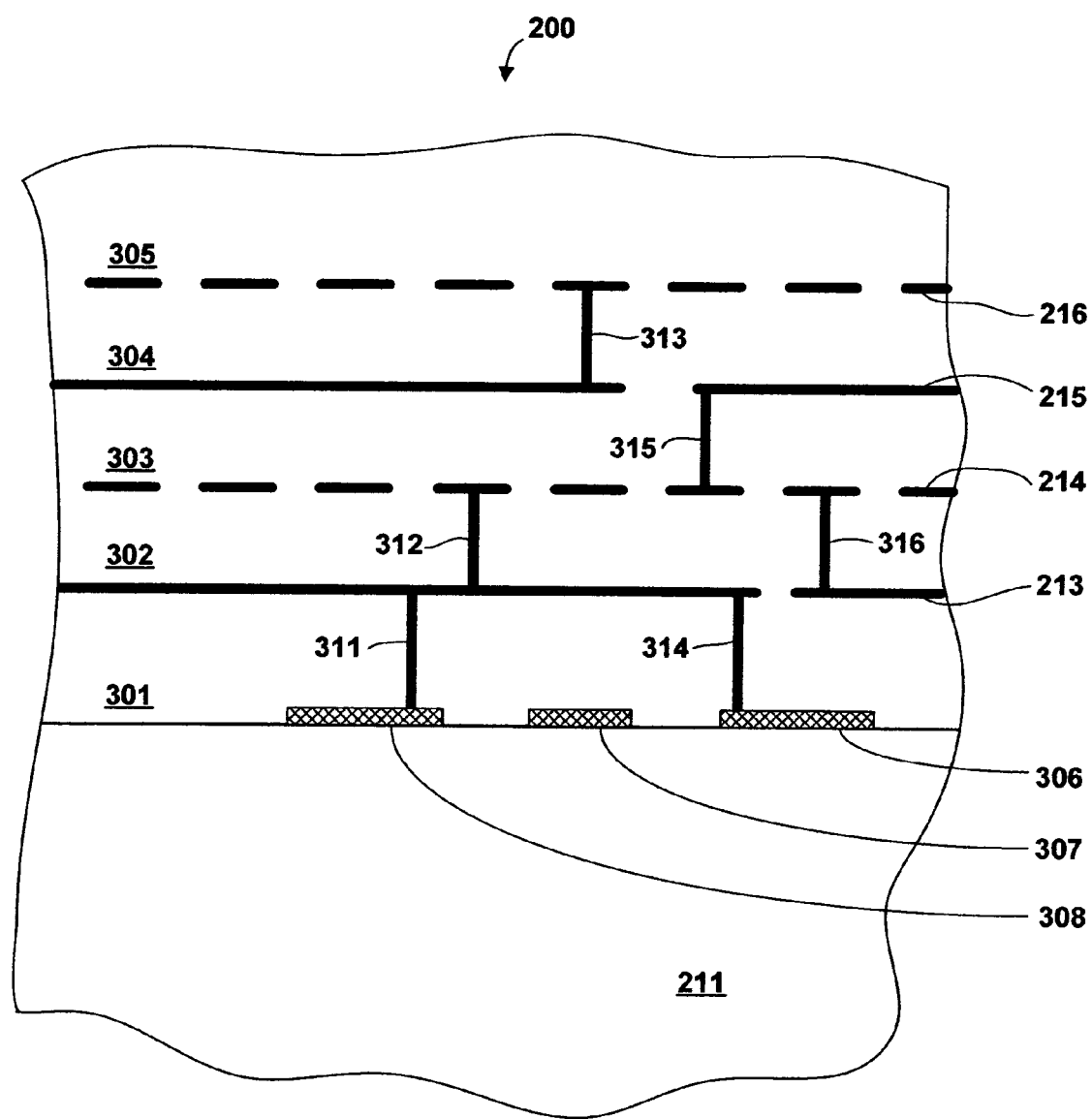
FIG. 3 is a simplified illustration of a portion of an integrated circuit module in cross-sectional view, according to the preferred embodiment.

FIG. 2 and FIG. 3 are simplified illustrations of an integrated circuit module 200, also called a "chip", according to the preferred embodiment. Integrated circuit module 200 is shown in FIG. 2 in a cut-away, top view representation. A portion of integrated circuit module 200 is shown in cross-section in FIG. 3 Integrated circuit module 200 represented in FIGS. 2 and 3 may be any of modules 111A–D, 112A–F, 115A–C, 116A–116C, 117A–B, 118A–B, or 119A–B, or could be some other module not represented in FIG. 1. Integrated circuit module 200 contains a chip 201, i.e. various electronic circuits and elements formed on a single relatively broad, flat semiconductor substrate. The substrate and electronics integrally formed thereon (chip) is surrounded by and encapsulated in a protective insulator 202. The entire assembly is typically mounted on an electronic circuit card (not shown) having multiple conductive paths for connecting the module to other components of a digital device. Such a card often has multiple integrated circuit modules mounted thereon. Multiple conductive lines 203 emanate from the substrate chip and connect to I/O pins 204 which extend from module 200. I/O pins 204 are coupled to the conductive paths in the electronic circuit card. Although the I/O pins are shown in FIG. 2 along the two edges of module 200 for illustrative purposes, they are often mounted along all four edges. Alternatively, I/O connections may be formed in various other ways, now known or hereafter developed; e.g., I/O connections can be formed in the bottom of the module, using pins, pads, or balls.

Chip 201 is a thin, flat member which is constructed in multiple layers. The bottom layer is a semiconductor substrate 211, which is typically silicon, although other materials, such as SiGe, SiC and GaAs, are possible. The semiconductor layer may optionally be deposited over one or more layers of a different material providing structural support or other function, such as sapphire. Multiple active and/or passive devices 212, such as field-effect transistors, are formed on the substrate by selective doping of the substrate, and deposition of additional insulator (dielectric) and conductive material. Logic circuits are created by connecting the various active and passive devices in a desired configuration, and providing power and ground connections to the active devices. Conductive interconnections between active devices are placed in multiple layers containing conductors 213–216, each layer being separated from adjacent layers by insulative layers 301–305.

Since the number of active devices and interconnections is typically very large, and the design of an integrated circuit typically requires interconnections in various directions, physical placement of interconnections is a challenging design issue. Generally, individual conductors within a conductive layer run in a single direction, the direction alternating at right angles with successive conductive layers, the individual conductors within the conductive layer being electrically isolated from one another by dielectric material. Conductive vias 311–316 penetrate the insulative layer or layers between conductive layers, to make electrical connections. A conductive via may run between two conductors in different conductive layers (as represented in FIG. 3 by vias 312, 313, 315 and 316), or between some part of an active or passive device 306–308 and a conductive layer (as represented in FIG. 3 by vias 311 and 314. A single conductive path may traverse several conductive layers and several vias.

It will be understood that FIGS. 2 and 3 are intended as a high-level representation of an integrated circuit module for illustrative purposes, and are not necessarily to scale. The actual number of active devices contained on a single chip module is so large and the size of an individual device so small as to be difficult or impossible to illustrate to scale in a single drawing. Furthermore, while four conductive layers are shown, the actual number of such layers may vary.

In order to support improved capabilities of computer systems and other digital devices, it is desirable to decrease the size of, and increase the number of, active and/or passive devices in an integrated circuit chip. Increasing the number of devices requires an increase in the number of conductive interconnections. Simply making all the conductors smaller and placing them closer together, without other design modifications, can result in increased resistance and capacitance of the conductors. Using conventional technology, signal wire capacitance in the interconnection conductors is a serious limitation on the speed of future integrated circuit designs.

In accordance with the preferred embodiment of the present invention, parasitic capacitance of signal wires in an integrated circuit chip is generally reduced, independently of other design factors, by using a dielectric structure having cylindrical, oriented voids. The voids are formed in the dielectric structure by growing carbon nanotubes in place, depositing a dielectric material surrounding the carbon nanotubes, and subsequently removing the carbon nanotubes to leave the voids. Various additional process steps are performed in the preferred embodiment, as further described herein. Because the dielectric constant of air (1) is much less than the dielectric constant of a typical dielectric material such as silicon oxide (nearly 4), the dielectric constant of a composite structure of typical dielectric material having cylindrical air voids is between these two values, i.e. significantly less than that of the raw dielectric material.

Figure 4A:
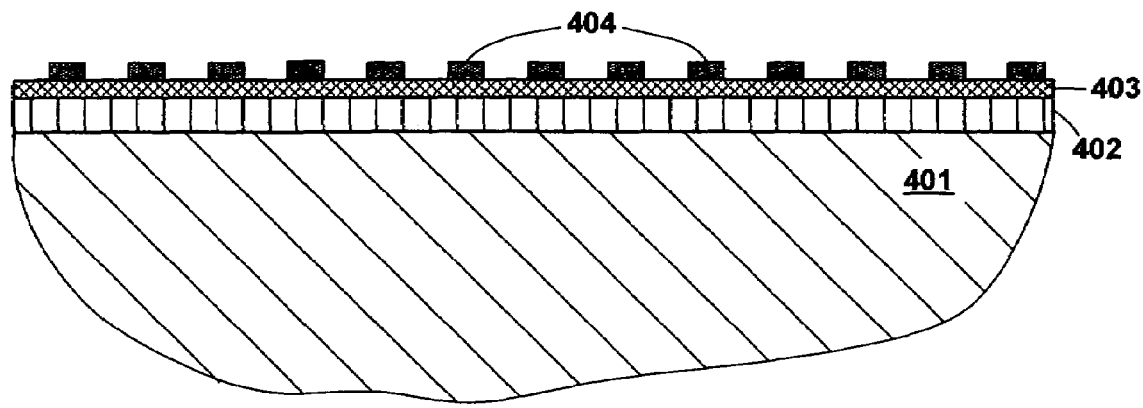
FIGS. 4A–4H are simplified enlarged cross-sectional views of a portion of an integrated circuit chip, showing the construction of a dielectric structure having voids, in accordance with a first preferred embodiment.
Figure 4B:
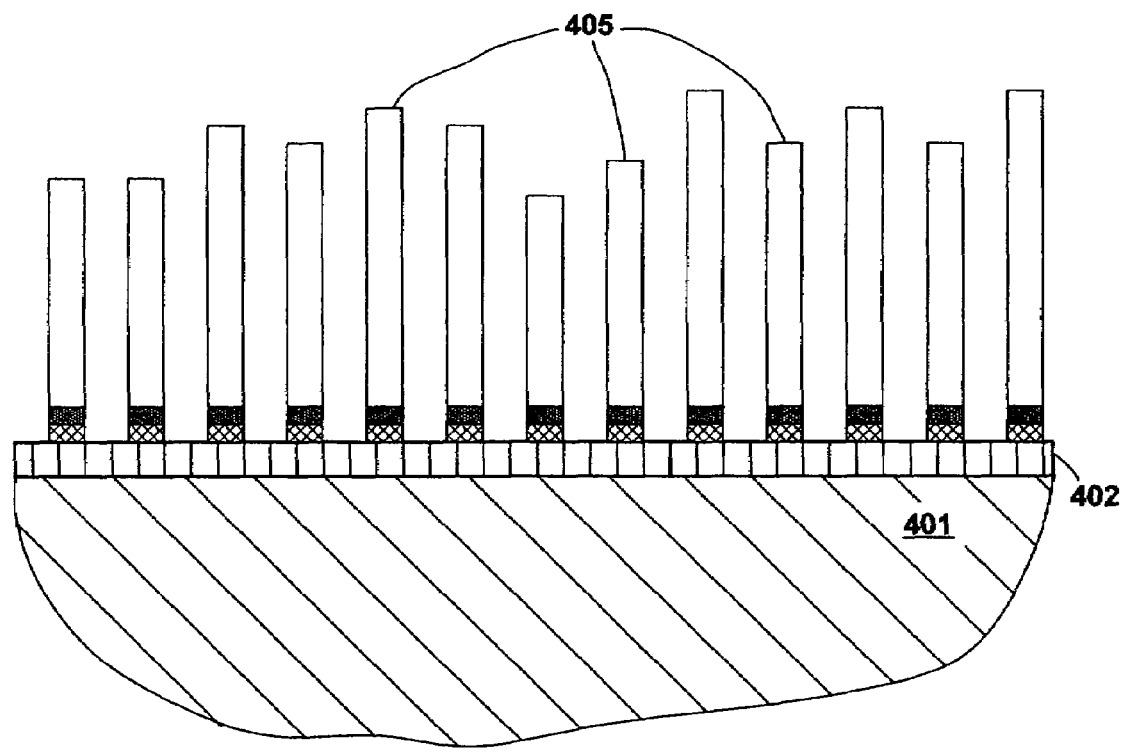
Figure 4C:
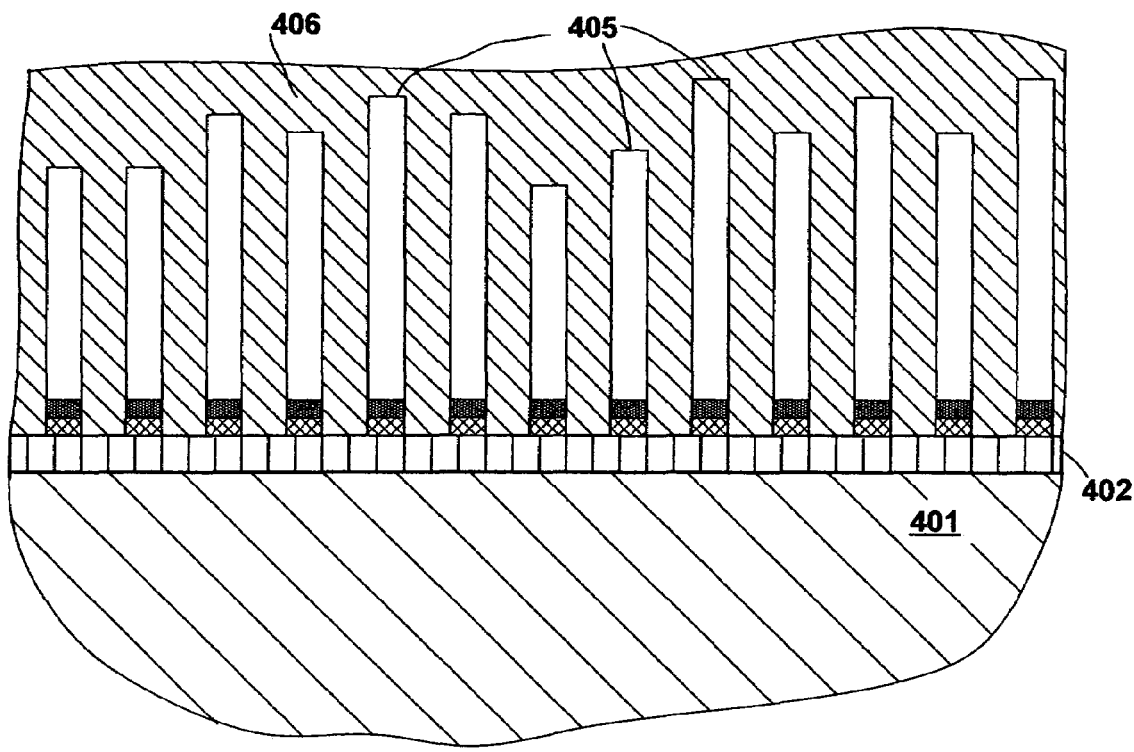
Figure 4D:
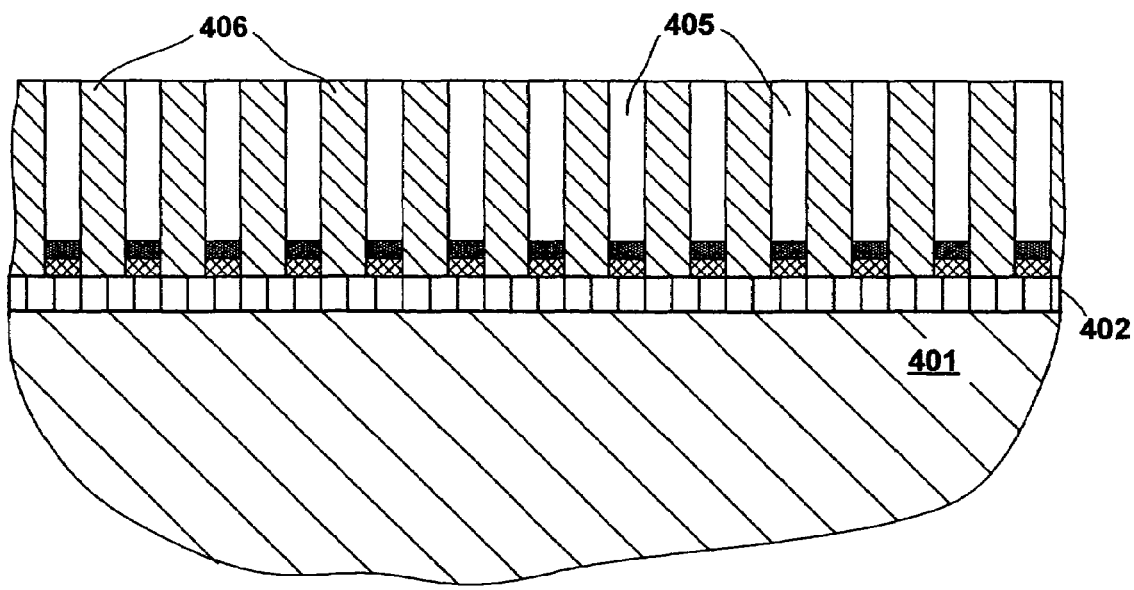
Figure 4E:
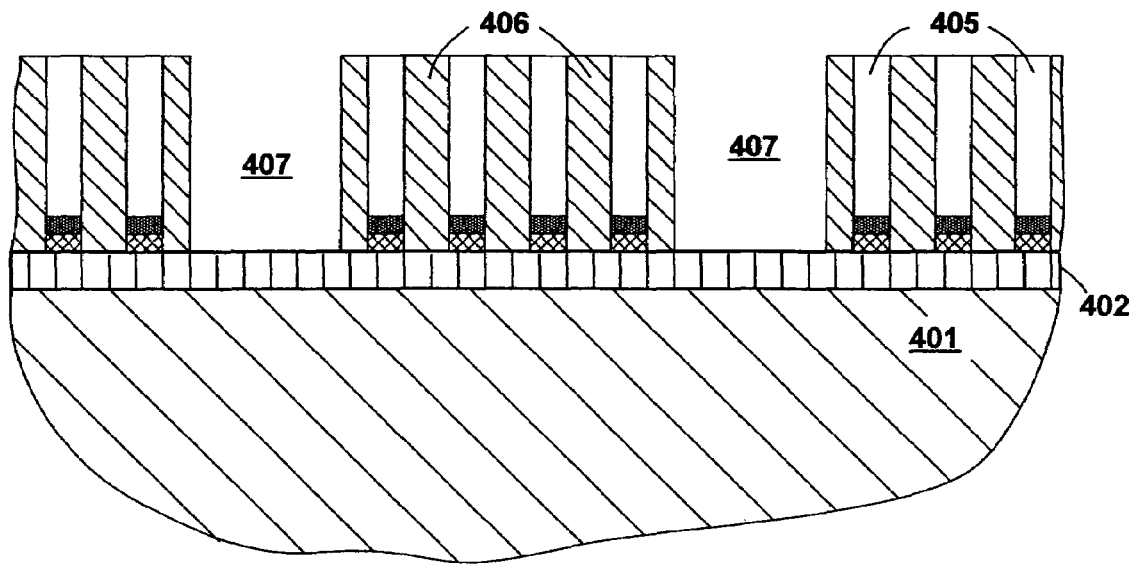
Figure 4F:
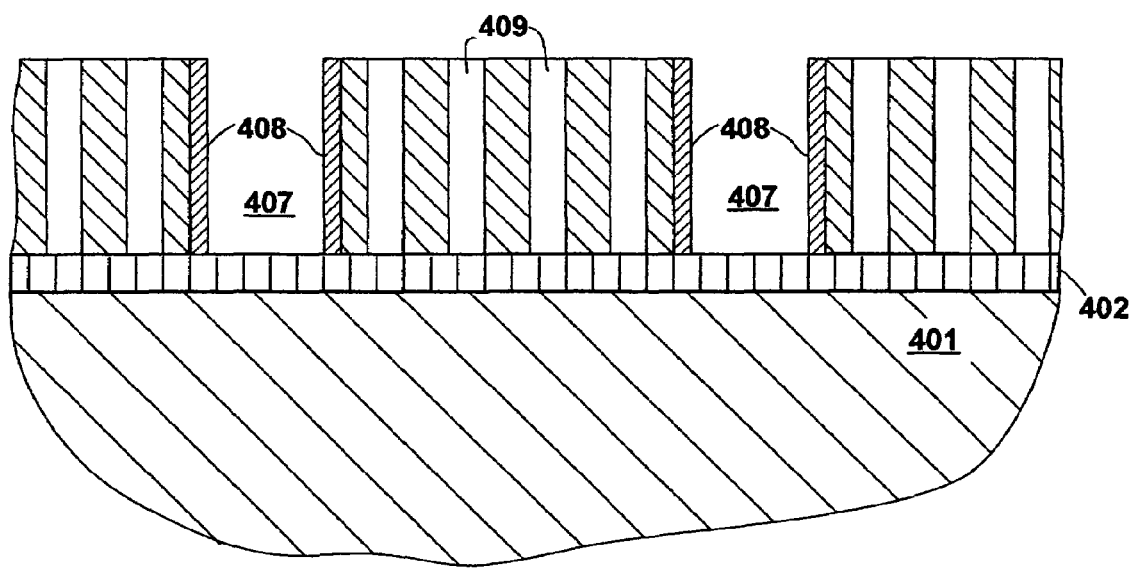
Figure 4G:
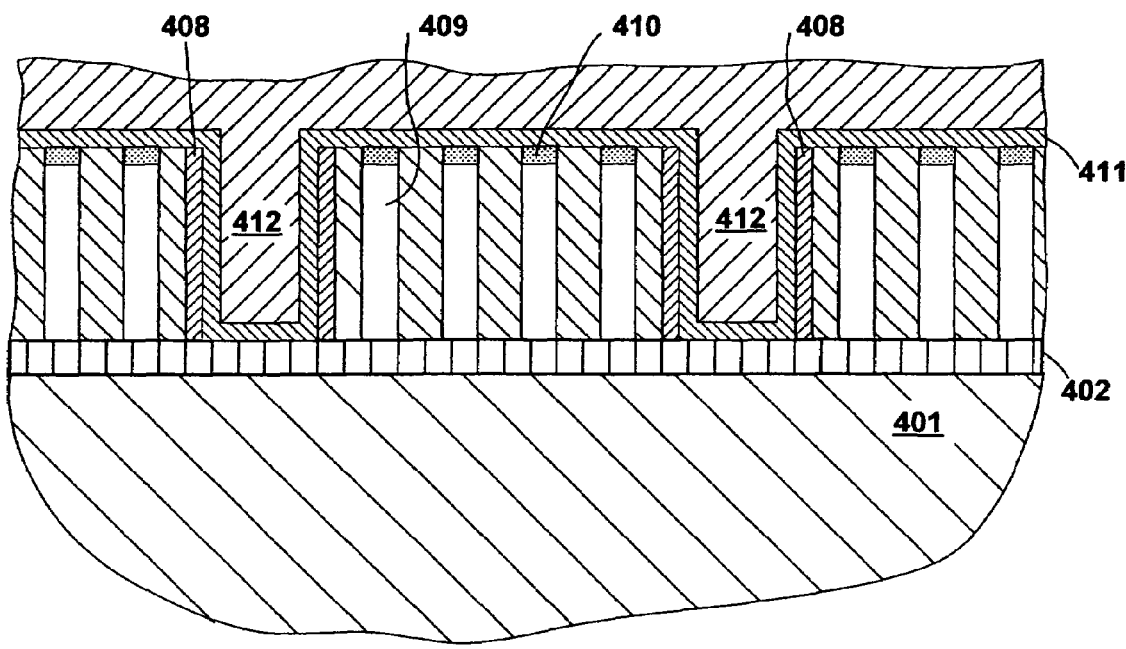
Figure 4H:
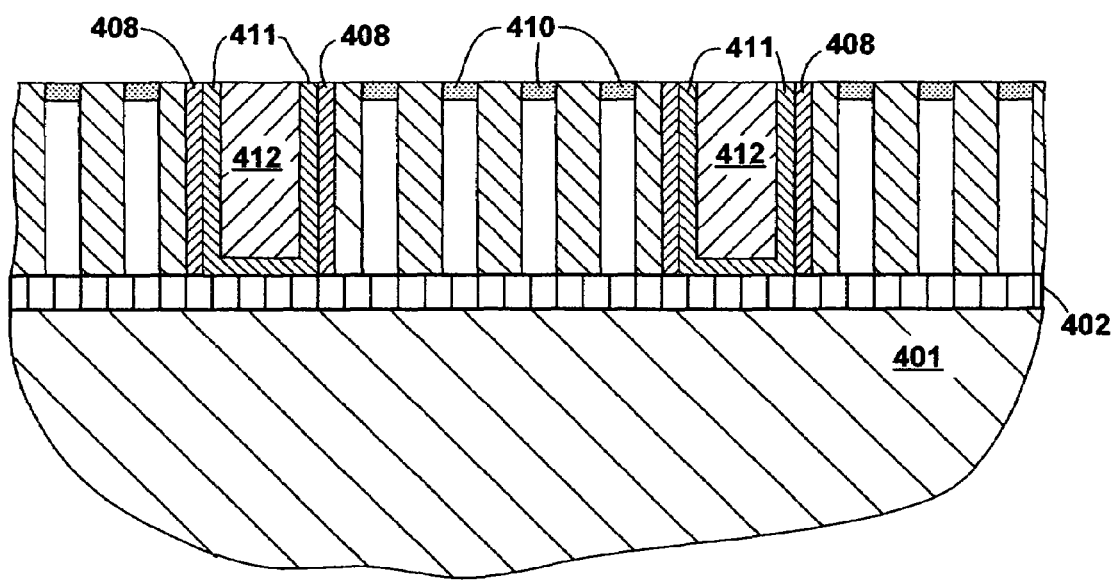
Figure 5A:
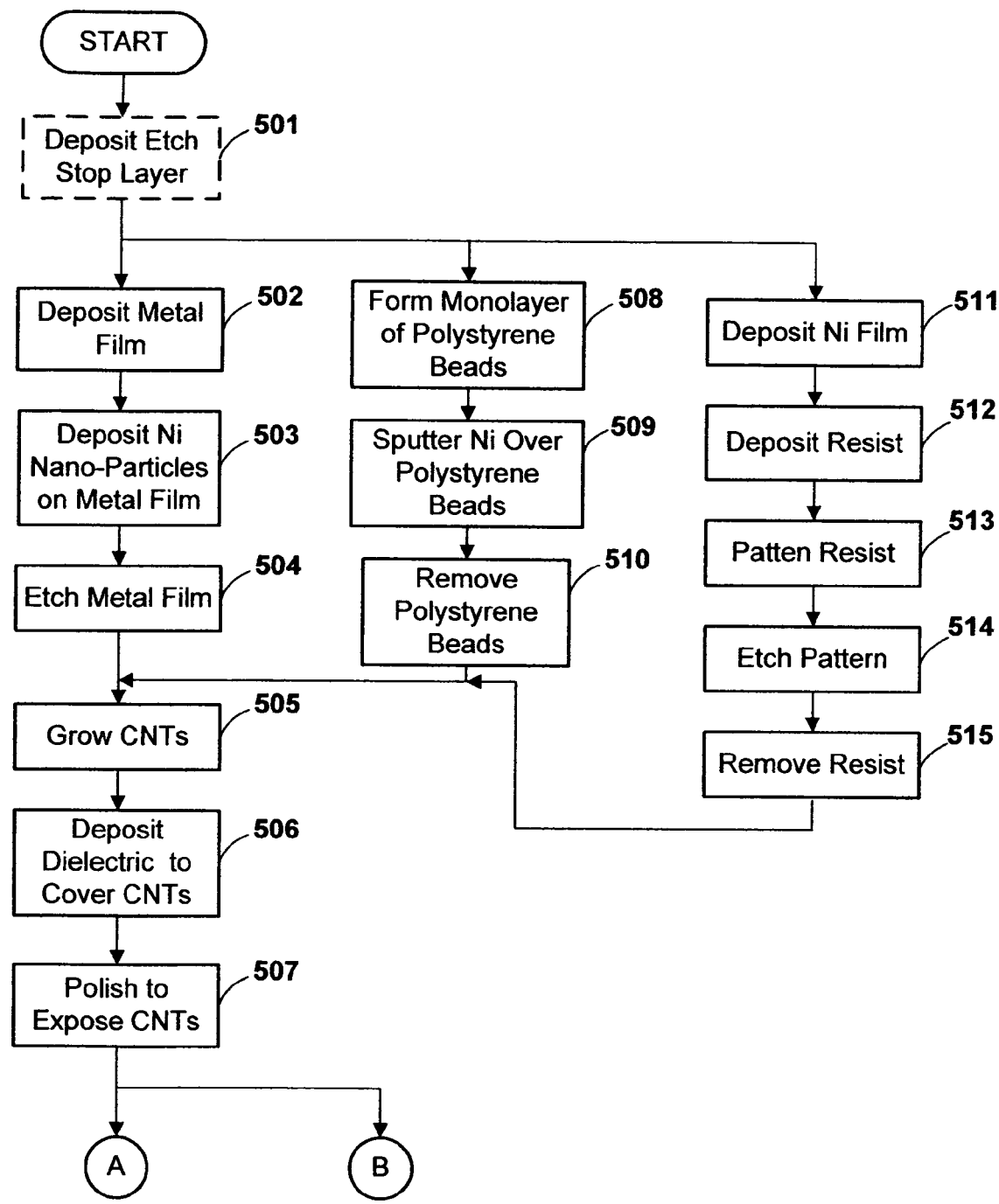
FIGS. 5A, 5B and 5C (herein collectively referred to as FIG. 5) are a flow diagram showing the overall process steps for forming a dielectric structure having multiple cylindrical voids, according to a preferred embodiment and certain alternatives.
Figure 5B:
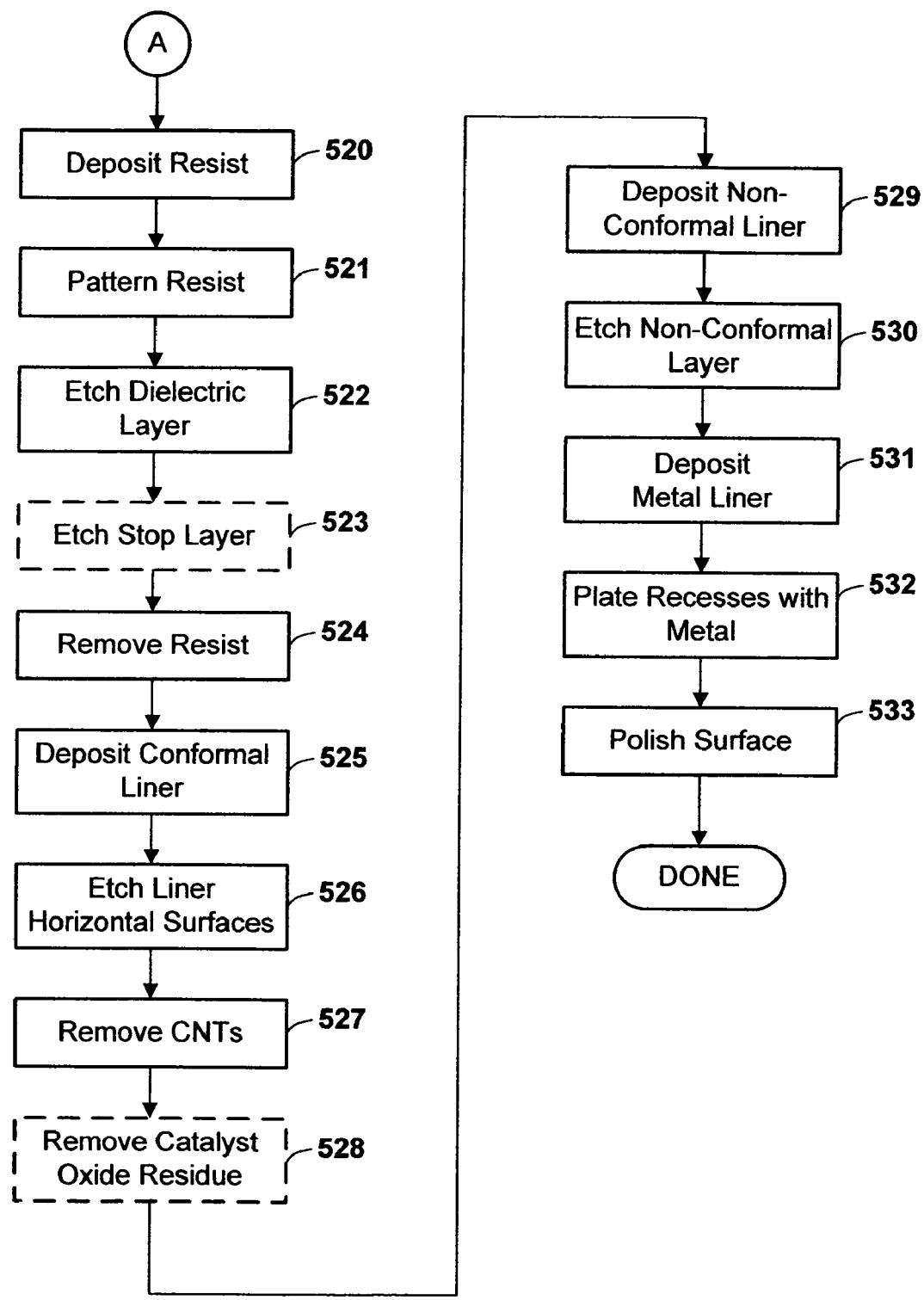
Figure 5C:
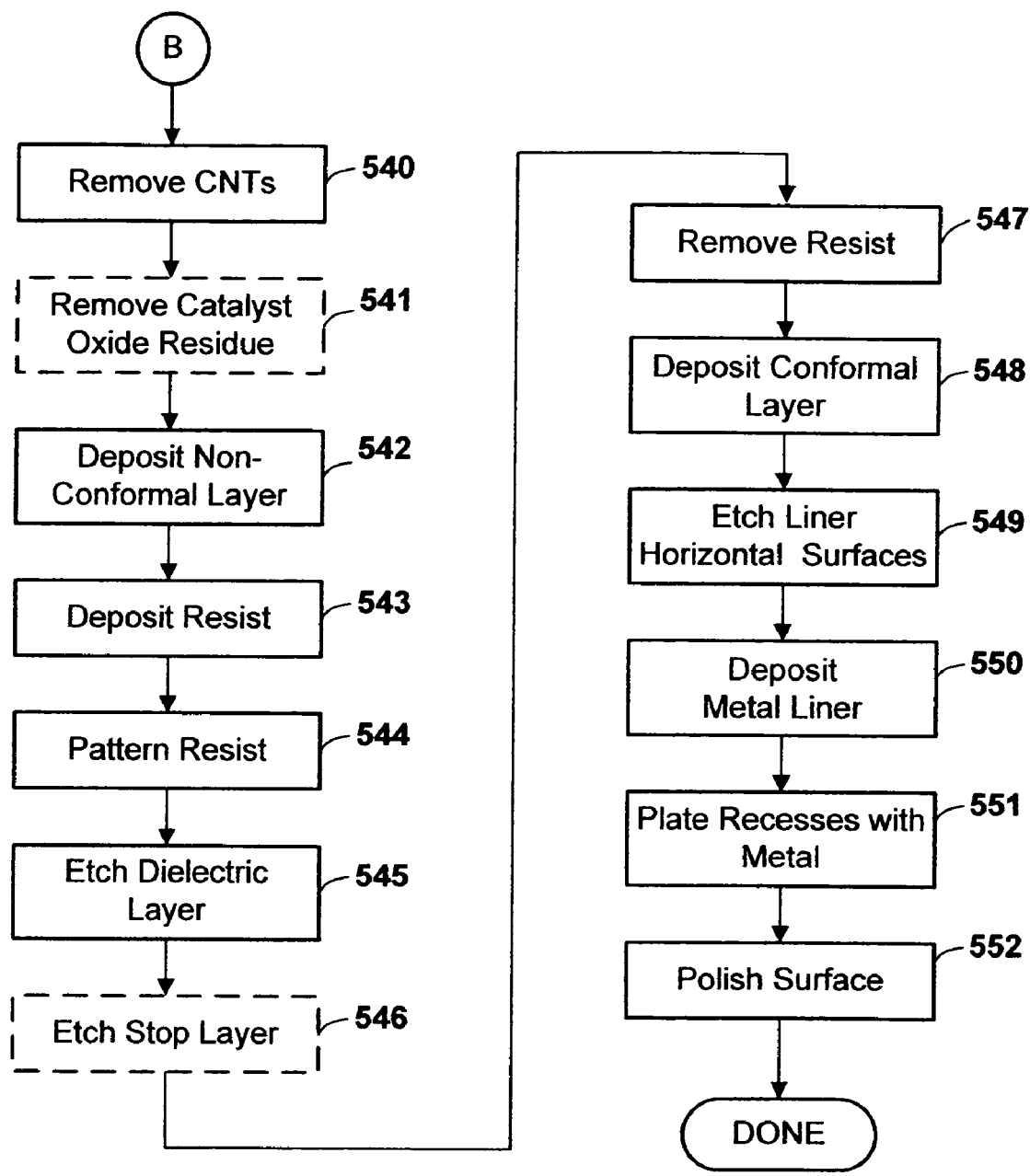

A preferred process and several alternatives for forming a dielectric structure having multiple cylindrical, oriented voids within an integrated circuit will now be described, with reference to FIGS. 4A–4H, 5A–5C, and 6A–6D. FIGS. 5A, 5B and 5C (herein collectively referred to as FIG. 5) are a flow diagram showing the overall process steps for forming a dielectric structure having multiple cylindrical voids, according to a the preferred embodiment and certain alternatives. FIGS. 4A–4H are simplified enlarged cross-sectional views of a portion of an integrated circuit chip, showing the construction of a dielectric structure having voids at various stages, in accordance with a first preferred embodiment. FIGS. 6A–6D are simplified enlarged cross-sectional views of a portion of an integrated circuit chip, showing the construction of a dielectric structure having voids at various stages, in accordance with the second preferred embodiment. It should be understood that FIGS. 4A–4H, and FIGS. 6A–6D are not necessarily drawn to scale, and in particular, the size and number of certain features such as carbon nanotubes and catalyst particles have been altered for illustrative purposes. While the processes below are illustrated and described with respect to a single layer of a dielectric structure for clarity, it will be understood that in a typical implementation, multiple layers are successively built in a single integrated circuit chip.

As is known, integrated circuit chips are typically built up in layers from a wafer substrate, successive layers being deposited according to any of various processes, sometimes selectively removed to create features, and eventually covered by other layers. The process of creating a dielectric structure having oriented cylindrical voids according to the preferred embodiment begins from a base layer 401 of the wafer, illustrated in FIG. 4A. Base layer 401 could be a layer of active and/or passive devices formed on or in the substrate, or could be a previous insulative layer (which could be formed from a dielectric structure having voids), or could be a previous conductive layer (which could be formed as multiple conductors which are electrically isolated by a dielectric structure having voids). In accordance with the preferred embodiments of the present invention, an integrated circuit chip could be constructed in which all insulative structures include voids, or in which fewer than all of the insulative structures include voids. In addition to the techniques described herein, base layer 401 could be fabricated according to any conventional technique, or any technique hereafter developed.

From the base layer 401, a thin layer of etch stop material 402 is optionally deposited over the base (step 501). The purpose of the etch stop is to control the depth of etching and protect underlying structures during later process stages. The etch stop material layer 402 is preferably silicon nitride, although other materials might be used, and has a depth of approximately 10–20 nm. Where underlying layers are not likely to be affected by etchants used in later stages, the etch stop layer may be unnecessary.

The wafer is then coated with a thin film (approximately 2–6 nm thick) of a metal 403, which will serve as a base for the catalyst (step 502). The metal film is preferably chromium, tungsten or titanium. A catalyst of nickel nano-particles 404 is then deposited on the metal film (step 503). Preferably, this is accomplished by processing the metal-coated wafer in an electrolyte solution of nickel sulfate with boric acid, and treating with a pulse-current electrochemical deposition. This process deposits nano-particles of nickel evenly dispersed across the wafer surface. The size and density of nickel particles thus deposited can be controlled by altering the concentration of nickel in the electrolyte solution, the concentration of mineral acid in the solution, the current density and the duration of the electrochemical deposition. Initial particle sizes of 50–100 nm are readily generated by this method, the particles preferably being later trimmed. FIG. 4A shows a resulting portion of a chip surface in cross section, after performing step 503, it being understood that base layer 401 is shown in simplified form and may contain complex structures, and that additional layers (not shown) may be formed below base layer 401. FIG. 4A (as well as certain subsequent figures) shows optional etch stop layer 402, although it is understood that in some embodiments step 501 will not be performed, and etch stop layer 402 will not be present.

The wafer assembly is then etched to remove most of the metal film and to trim the nickel catalyst particles to a size of approximately 10–30 nm diameter (step 504). A sputter etch process using chlorine/argon can be used for this step.

A process and various alternatives for constructing a catalyst of nickel nano-particles on the wafer surface, as described above with respect to steps 502–504, is further described in U.S. Patent App. Pub. 2004/0058153 A1, published Mar. 25, 2004, which is herein incorporated by reference.

Any of various techniques, alternative to the techniques described above and represented in steps 502–504, might be used for establishing a catalyst on the wafer surface. Two such alternatives are represented in FIG. 5 as step 508–510, and as steps 511–515.

In a first alternative for establishing a catalyst, polystyrene nanosphere lithography is used to create a pattern of nickel catalyst particles. A monolayer of polystyrene nanosphere beads is formed on the wafer surface (step 508). Preferably, the monolayer is created by forming a monolayer on a deionized water surface, the water being treated with dodecylsodiumsulfate solution to reduce the surface tension, and draining the water over the wafer surface to deposit the monolayer. The beads, being spherical, form in a regular pattern and act as a sputter mask for catalyst deposition. A nickel catalyst is then sputter-deposited over the surface, the nickel depositing on the beads and into the spaces between the beads (step 509). The beads are then washed from the substrate with toluene (step 510).

In a second alternative embodiment for establishing a catalyst, nano-particles of nickel are defined lithographically, by first depositing a nickel film approximately 15 nm thick (step 511), and depositing a resist over the nickel film (step 512), and patterning the resist in a desired pattern (step 513). The resist can be patterned optically or with an electron beam. In one embodiment, a method of interference lithography could be used, in which multiple beams from a diffraction grating form a regular pattern on the wafer surface. The nickel is then wet etched according to the pattern (step 514). By adjusting the time and/or concentration of the wet etch, it is possible to control the amount of lateral etching of the nickel, and thus adjust the size of the nickel particles (e.g., to approximately 10–30 nm). The remaining resist is removed (step 515).

After depositing a catalyst on the wafer surface by any of the various methods described above, carbon nanotubes 405 are then grown from the catalyst particles (step 505). Preferably, the wafer assembly is placed in an atmosphere of acetylene and ammonia at approximately 500–700° C., for a few minutes in order to grow short nanotubes of about 0.3–1.0 µm in length. Alternatively, an atmosphere of carbon monoxide and diatomic hydrogen at 700–900° C. could be used. The acetylene/ammonia mixture is preferable because it can be carried out at lower temperatures which are less likely to damage the wafer assembly. The carbon nanotube growth process is preferably carried out in a plasma chemical vapor deposition chamber in the presence of an electric field for vertical growth of the carbon nanotubes. The carbon nanotubes thus produced are preferably predominantly single walled, although they may include some multi-walled nanotubes, some being conductive and some being semiconductors. The electrical characteristics of the carbon nanotubes is not important, since they will later be removed and serve only to create voids in the dielectric. The electric field of the preferred embodiment imposed during carbon nanotube growth causes the nanotubes to grow in an aligned orientation, substantially perpendicular to the wafer surface. It is alternatively possible to obtain substantially perpendicular tube growth under some conditions without the presence of an electric field. FIG. 4B shows a resulting portion of the chip surface in cross section, after performing step 505, this being the same chip portion as that depicted in FIG. 4A. It will be understood that FIG. 4B and subsequent figures represent the chip in cross section assuming that the preferred method described above with respect to steps 502–504 was used to deposit the catalyst particles. If either of the alternative methods was used, the nickel catalyst 404 would rest directly on the etch stop layer, without any intermediate metal film 403.

The diameter of the carbon nanotubes can be controlled by varying the catalyst dimension and/or other process parameters. In general, it is known that carbon nanotubes ranging from less than one nanometer in diameter to tens of nanometers can be produced. In the preferred embodiment, the diameter of the carbon nanotubes is generally less than 50 nm, and more specifically, it is preferred to be in the range of 10–30 nm. The diameter and the density together should be sufficient so that a significant proportion of the volume of the dielectric is contained in the voids produced after removal of the carbon nanotubes.

A dielectric material 406 is then deposited over the surface of the wafer, surrounding the carbon nanotubes, and preferably covering them (step 506). Any of various dielectric materials, now known or hereafter developed, can be used. In particular, conventional dielectrics such as silicon oxide, fluorinated silicon oxide, silicon-germanium oxide or SiCOH are suitable materials, as they can be processed using known semiconductor processing techniques. The dielectric is deposited to a thickness of approximately 0.8–1.5 µm. FIG. 4C shows the resulting portion of the chip surface in cross section, after performing step 506.

The wafer assembly is then subjected to a chemical-mechanical polish to expose the tips of the carbon nanotubes, and to establish a uniform, specified thickness of the dielectric layer (step 507). FIG. 4D shows the resulting portion of the chip surface in cross section, after performing step 507.

At this point, two alternative process paths exist. In a first path, represented in FIG. 5B, the dielectric is patterned for metal conductors (vias and trenches) before removal of the carbon nanotubes to create air voids in the dielectric. In a second path, represented in FIG. 5C, the carbon nanotubes are removed first, and the dielectric structure is then patterned for metal conductors.

In the first path, the dielectric structure having embedded carbon nanotubes produced as described above is etched according to a pre-determined pattern for metal wires and vias. Patterning the dielectric is preferably performed using conventional dielectric patterning processes. Specifically, an anti-reflective coating and resist are sequentially spin-applied to the surface of the wafer (step 520). The resist is then exposed to a wiring image to create the via and/or wiring trench pattern in the resist (step 521). The wafer assembly is then exposed to a suitable etchant to etch the dielectric material at the locations of the future vias and/or wiring trenches (step 522). The silicon nitride stop layer 402, if present, helps control the depth of etching in step 522. If a silicon nitride stop layer is present, the relatively thin stop layer is then removed at the bottom of the vias and trenches with a brief, uniform etch of the exposed nitride layer (step 523). The resist is then cleaned from the wafer surface (step 524). FIG. 4E shows the resultant portion of the chip surface in cross section, after performing step 524. As depicted in FIG. 4E, two sections of dielectric have been removed to create recesses 407, which could either be future vias or wiring trenches.

A thin film liner, approximately 3–10 nm thick, of a dielectric material (such as silicon oxide or silicon oxynitride) is deposited conformally on the exposed surface of the wafer (step 525). A "conformal" film conforms to the surface irregularities, and in particular lines the vertical walls of recesses 407. As is known in the art, a conformal film may be deposited using a plasma deposition in a chemical vapor deposition chamber operating at relatively low pressure and high power. Alternatively, the thin film liner may be deposited by atomic layer deposition, a process which is known to produce very conformal films. Silicon nitride, silicon oxide, and aluminum oxide are examples of dielectric films that can be deposited with this technique. As a further alternative, it may be possible to use conductive films such as tantalum nitride, tantalum, titanium nitride or titanium, which can be deposited conformally using atomic layer deposition. The conformal film is then subjected to a directional reactive ion etch to remove the film from the horizontal surfaces (step 526), leaving a film 408 on the vertical surfaces, i.e., the vertical walls of recesses 407. The reason for lining the vertical walls of recesses 407 is that the process of patterning the dielectric (steps 520–524) may expose some carbon nanotubes at the vertical walls of the recesses (not visible in the drawing). When these carbon nanotubes are later removed to create voids, the vertical walls will have small vertical ridge recesses at these locations, which will ultimately become line edge roughnesses in the conductive metal which will be introduced into the recesses. To avoid these line edge roughnesses (which can reduce conductivity of narrow conductors), the walls are first coated with a film 408 to seal the future voids.

The carbon nanotubes are then removed by ashing with ozone or oxygen plasma at 400° C., oxidizing the metal catalyst 404 and underlying remnant of metal layer 403 (step 527). Removing the carbon nanotubes leaves vertical, cylindrical voids 409 in the dielectric. The oxidized catalyst residue can be left in place, or optionally, the oxidized residue can be cleaned, e.g. with super-critical carbon dioxide cleaning, or with chelating agents to scavenge the metals (step 528). FIG. 4F shows the resultant portion of the chip in cross surface section, after performing step 528.

A thin non-conformal layer of dielectric, such as silicon oxide, silicon nitride or fluorinated silicon oxide, approximately 5–10 nm thick, is then deposited over the wafer surface (step 529). The non-conformal layer is deposited using a plasma deposition in a chemical vapor deposition chamber operating at a relatively high pressure and low power vis-a-vis the operating parameters used for a conformal layer. The non-conformal layer forms a plug 410 at the top of the cylindrical voids 409, but does not fill the voids. The non-conformal layer is then subjected to a brief reactive ion etch (step 530). The etch is sufficient to remove the non-conformal layer from the bottoms of recesses 407 and from the exposed top surface of the wafer, but not to entirely remove the plugs 410.

A thin metal liner 411, approximately 2–4 nm thick, is then deposited over the exposed wafer surface using conventional methods (step 531), lining the bottoms and sidewalls of recesses 407. The metal liner is preferably tantalum, tantalum nitride, or titanium nitride, although other materials could be used. The metal liner forms a base for deposition of metal into the recesses, and acts as a barrier to prevent the migration of certain metals (such as copper) into the dielectric. The wafer is then plated with a conductive metal to fill the recesses (step 532), forming metal conductors 412 in the recesses. The conductive metal is preferably copper, although other materials could be used. FIG. 4G shows the resultant portion of the chip in cross surface section, after performing step 532.

The excess metal and liner is then removed by chemical mechanical polishing to prepare the wafer assembly for the next chip layer (step 533). Further construction of the integrated circuit chip may then continue by forming another dielectric layer and patterning for vias and/or wiring trenches at appropriate locations. Depending on the nature of the metal conductors 412 formed within former recesses 407, it may be necessary to first form a barrier liner (such as Ta, TaN or TiN) over the metal to prevent migration. I.e., if the dielectric layer structure created as described above is part of a dielectric layer (e.g. 302) between two conductive layers (e.g., 213, 214) in the chip, then the metal conductors 412 are vias and require no isolation from the next (conductive) layer; if, however, the dielectric structure is part of a conductive layer (e.g., 213), then the metal conductors 412 are mostly horizontal conductors, which should be isolated by a barrier liner from the dielectric layer above them. Preferably, all dielectric structures in conductive layers of the chip or between conductive layers are formed using a process described herein, although it would alternatively be possible to form only some dielectric structures layers using such a process. FIG. 4H shows the resultant portion of the chip in cross section after performing step 533.

A second (alternative) path after performing step 507 above is illustrated in FIG. 5C. In the second path, the carbon nanotubes are removed before patterning the dielectric for the metal conductors. Referring to FIG. 5C, the carbon nanotubes are first removed by ashing with ozone or oxygen plasma at 400° C., oxidizing the metal catalyst 404 and underlying remnant of metal layer 403 (step 540). Removing the carbon nanotubes leaves vertical, cylindrical voids 601 in the dielectric. The oxidized catalyst residue can be left in place, or optionally, the oxidized residue can be cleaned, e.g. with super-critical carbon dioxide cleaning, or with chelating agents to scavenge the metals. (step 541).

Figure 6A:
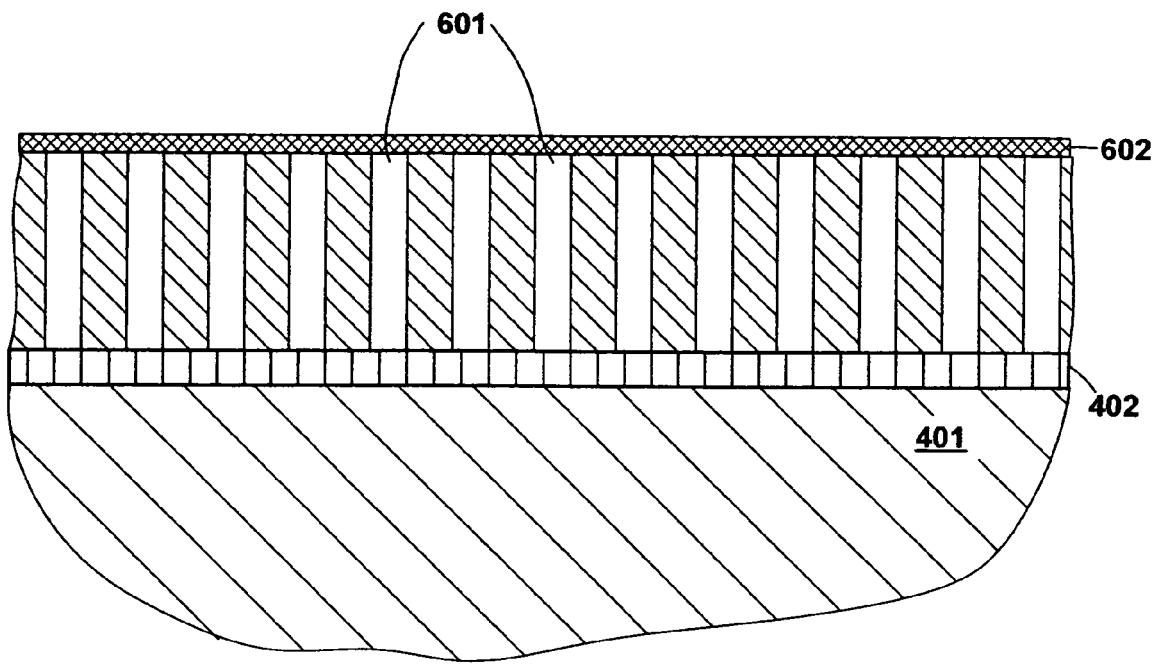
FIGS. 6A–6D are simplified enlarged cross-sectional views of a portion of an integrated circuit chip, showing the construction of a dielectric structure having voids, in accordance with a second preferred embodiment.

A thin non-conformal layer of dielectric 602 is then deposited over the wafer surface (step 542). The non-conformal layer covers the voids 601, but does not fill them. The non-conformal layer may be a material such as silicon oxide or fluorinated silicon oxide, or could be a hard mask such as silicon nitride or a hard mask anti-reflective coating mixture of silicon-carbon-oxygen-nitrogen, available commercially from TEL as TERA™. These hard masks could also be used as polish stops in the subsequent metal polishing step. FIG. 6A shows the resultant portion of the chip surface in cross section, after performing step 542.

Figure 6B:
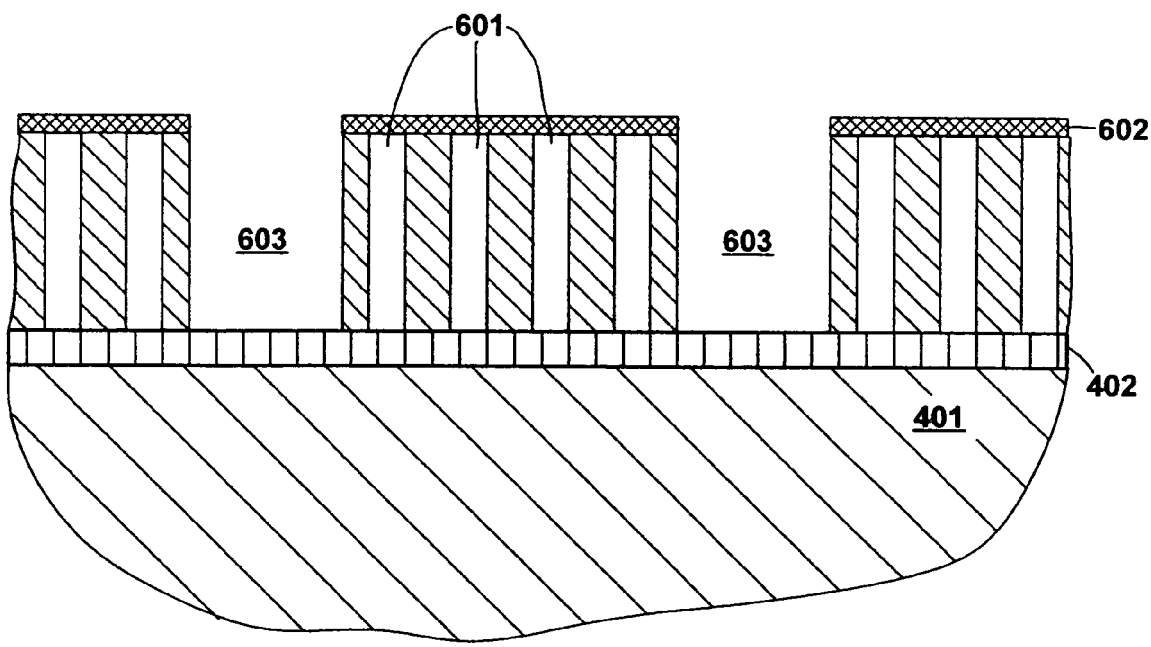

The dielectric structure is then patterned according to a pre-determined pattern for metal horizontal conductors and vias. Patterning the dielectric is preferably performed using conventional dielectric patterning processes. Specifically, an anti-reflective coating and resist are sequentially spin-applied to the surface of the wafer (step 543). The resist is then exposed to a wiring image to create the via and/or wiring trench pattern in the resist (step 544). The wafer assembly is then exposed to a suitable etchant to etch the dielectric material at the locations of the future vias and/or wiring trenches (step 545), stopping at the silicon nitride stop layer 402, if present. If stop layer 402 is present, it is then removed at the bottom of the vias and trenches with a brief, uniform etch of the exposed stop layer (step 546). The resist is then cleaned from the wafer surface (step 547). FIG. 6B shows the resultant portion of the chip surface in cross section, after performing step 547. As depicted in FIG. 6B, two sections of dielectric have been removed to create recesses 603, which could either be future vias or wiring trenches.

A thin film liner, approximately 3–10 nm thick, of a dielectric material (such as silicon oxide or silicon oxynitride) is then deposited conformally on the exposed surface of the wafer (step 548), so that it lines the vertical walls of recesses 603, similarly to step 525. The conformal film is subjected to a directional reactive ion etch to remove the film from the horizontal surfaces (step 549), similarly to step 526, leaving a film 604 on the vertical walls of recesses 603.

Figure 6C:
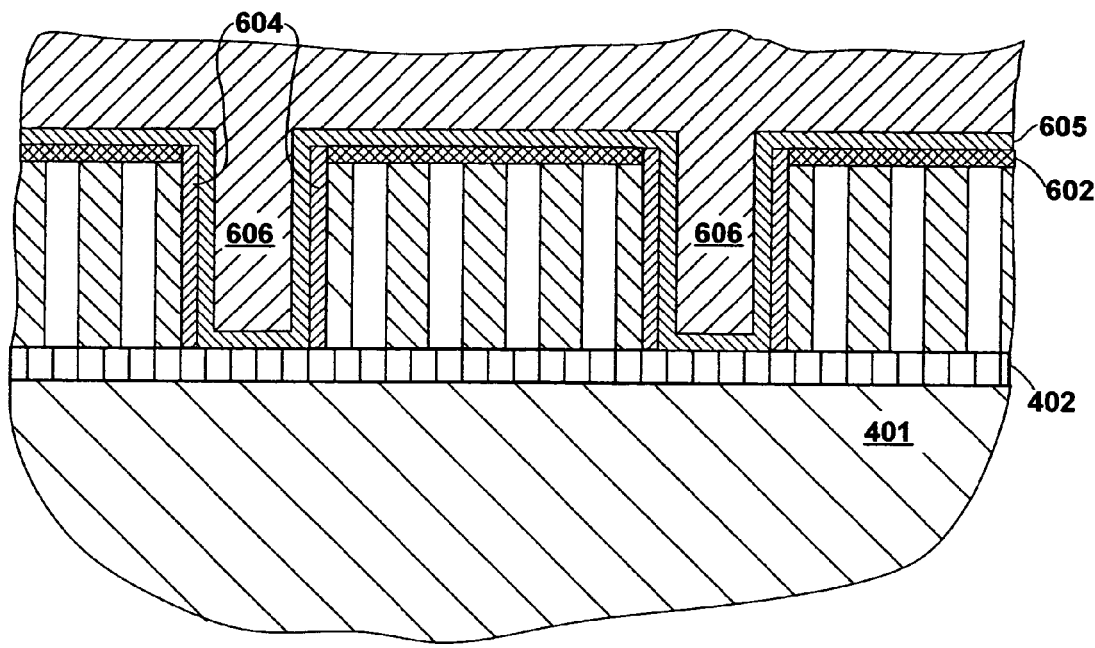

A metal liner 605, preferably Ta, TaN or TiN, approximately 2–4 nm thick, is then deposited over the exposed wafer surface using conventional methods (step 550), lining the bottoms and sidewalls of recesses 603, similarly to step 531. The wafer is then plated with a conductive metal (preferably Cu) to form metal conductors 606 in the recesses (step 551), similarly to step 532. FIG. 6C shows the resultant portion of the chip in cross surface section, after performing step 551.

Figure 6D:
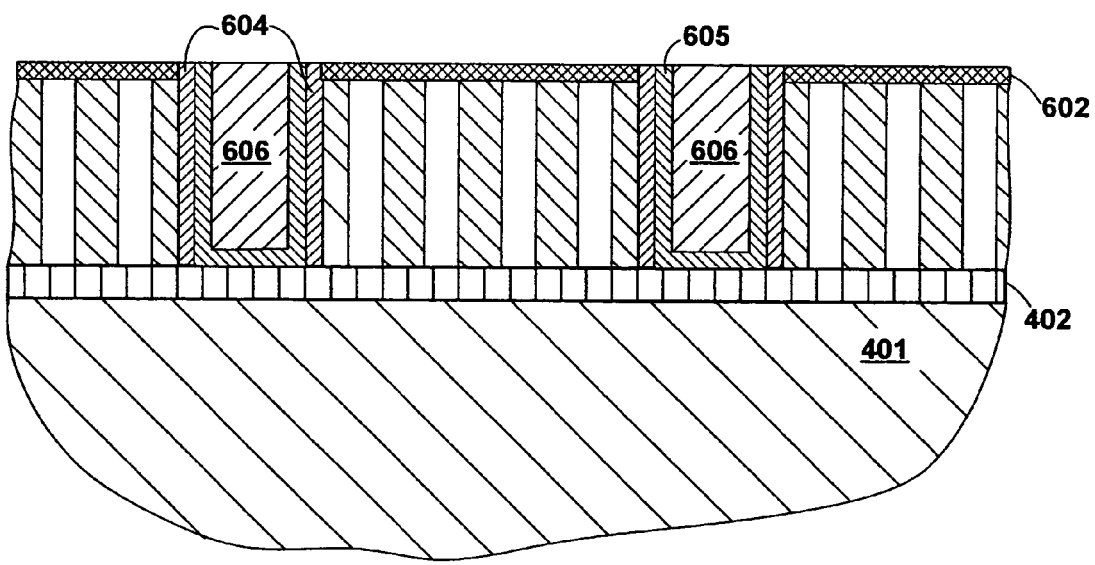

The excess metal and liner is then removed by chemical mechanical polishing to prepare the wafer assembly for the next chip layer (step 552). Depending on the processes used, the chemical mechanical polishing may remove all of layer 602, or may stop at layer 602, removing only a part of layer 602. Further construction of the integrated circuit chip may then continue by forming another dielectric layer and patterning for vias and/or wiring trenches at appropriate locations, as in the first preferred embodiment described above. FIG. 6D shows the resultant portion of the chip in cross section after performing step 552.

Whichever of the various alternatives above is used, the voids in the dielectric structure are of the same diameter and density as the original carbon nanotubes, from which the voids are produced. While certain variations are possible in the sizes of such voids, it is significant that the voids are substantially smaller than the conductive features, such as conductive lines and conductive vias. Current chip production technology produces vias as small as 90 nm, which can be placed on a pitch (via-to via spacing) of 180 nm. If a void were, e.g., on the order of 90 nm or greater, there could be insufficient dielectric material in the spaces between conductive features to provide mechanical support and stability for the chip structures. As explained above, using carbon nanotubes in the dielectric which are later removed to create voids, it is possible to create voids having diameters substantially smaller than the 90 nm via sizes (e.g., preferably 10–30 nm). In the future, it may be possible to produce oriented cylindrical voids of even smaller sizes and/or greater densities, which may be produced using carbon nanotubes, or by some newly developed process. The present invention is therefore not necessarily limited to the use of any particular process for producing oriented cylindrical voids, and in particular is not necessarily limited to processes using carbon nanotubes.

In particular, as one possible alternative method of producing cylindrical voids, the voids might be produced using some other narrow cylindrical structure as a form for the voids, the cylindrical form structure being removed after deposition of the dielectric material. For example, nanowires made from Ge, GaN or ZnO might offer a possible alternative. Ge nanowires can be deposited at 275° C. and removed with hydrogen peroxide. Use of Ge nanowires would potentially allows the creation of a low-k dielectric at lower temperatures and with a simpler wire removal step than used for carbon nanotubes.

In the process steps described above, the dielectric structure formed according to the various techniques described is patterned to create recesses for discrete conductors (horizontal conductors and/or vias). To the extent that the use of voids in the dielectric as described herein reduces the dielectric constant (k) of the resultant dielectric structure vis-a-vis conventional materials, it may be possible to reduce certain chip dimensions, such as the spacing between individual conductors, potentially increasing circuit density. Alternatively, if dimensions are maintained at conventional parameters and the dielectric constant (k) is reduced, the capacitance of the signal lines is reduces, potentially improving device speed. Either of these effects may be maximized, or dimensions may be chosen which achieve some combination of these effects.

Various dimensions, materials, process parameters and so forth have been given herein as representative or preferred values using available technology. However, it will be appreciated that as technological capabilities advance, new techniques for performing various processes or constructing integrated circuit components may be developed, and specifically new techniques for creating and manipulating carbon nanotubes may be developed. The representative techniques described herein are not intended to limit the present invention to any particular dimension, material, or process parameter.

An integrated circuit module has been shown and described in the preferred embodiment herein as a component of a digital computer system. However, as is well known, integrated circuit modules are used in a variety of digital devices. An integrated circuit chip in accordance with the present invention could be used in any digital device, whether or not such device is called a "computer system". A few examples of such devices include: limited function digital devices such as personal digital assistants, cell phones, digital cameras, controllers for buildings, automobiles and other machinery, robotic systems, and cell phones. However, as is well known, integrated circuit chips are being incorporated into an ever more devices, and the above enumeration should not be considered a complete enumeration or limitation on the types of devices which might use integrated circuit chips.

In the preferred embodiment, a dielectric layer having voids therein is constructed as a layer of an integrated circuit chip. However, a dielectric structure having narrow cylindrical voids as described herein might conceivably be constructed in other electrically insulative structures. For example, insulative structures used in so-called nano-technology components might benefit from the lower dielectric constant produced by introducing voids in accordance with the present invention. Whether such nano-technology components are deemed "integrated circuits", or by some other classification, the invention herein is not necessarily limited to what is conventionally understood as an integrated circuit.

Although a specific embodiment of the invention has been disclosed along with certain alternatives, it will be recognized by those skilled in the art that additional variations in form and detail may be made within the scope of the following claims:

What is claimed is:

1. A method of making an integrated circuit chip, comprising the steps of:
   providing a chip substrate having a plurality of active devices formed therein;
   forming a plurality of cylindrical form structures on a surface of said integrated circuit chip;
   depositing a layer of dielectric over said surface of said integrated circuit chip to surround said cylindrical form structures;
   removing said cylindrical form structures to create a dielectric layer structure having voids therein;
   patterning said dielectric to create a plurality of recesses in respective locations corresponding to a plurality of discrete conductors;
   lining vertical walls of each said recess with a conformal film dielectric to seal said voids from conductive material; and
   depositing a conductive material into said recesses after performing said steps of patterning said dielectric and lining vertical walls of each said recess to form said plurality of discrete conductors in said dielectric layer structure.

2. The method of claim 1, wherein said cylindrical form structures are carbon nanotubes.

3. The method of claim 2, wherein said step of forming a plurality of cylindrical form structures on a surface of said integrated chip comprises:
   forming a plurality of catalyst particles on said surface of said integrated circuit chip; and growing said plurality of carbon nanotubes in a substantially perpendicular orientation from said plurality of catalyst particles.

4. The method of claim 3, wherein said step of forming a plurality of catalyst particles on said surface of said integrated circuit chip comprises:
depositing a metallic base film for said catalyst particles; and
processing said integrated circuit chip having deposited therein said metallic base film in an electrolyte solution to deposit catalyst particles by pulse-current electrochemical deposition.

5. The method of claim 3, wherein said step of forming a plurality of catalyst particles on said surface of said integrated circuit chip comprises:
depositing a monolayer of polystyrene beads on said surface of said integrated circuit chip;
sputter depositing said catalyst onto said surface of said integrated circuit chip through spaces in said polystyrene beads; and
removing said monolayer of polystyrene beads.

6. The method of claim 3, wherein said step of forming a plurality of catalyst particles on said surface of said integrated circuit chip comprises:
depositing a film of a catalyst material on said surface of said integrated circuit chip; and
lithographically defining a pattern of discrete catalyst particles in said film.

7. The method of claim 1, wherein said dielectric layer structure is formed as a dielectric layer between two conductive layers of said integrated circuit chip, said plurality of discrete conductors in the dielectric layer comprising vias connecting respective pairs of conductors in said two conductive layers.

8. The method of claim 1, wherein said dielectric layer structure is formed as a dielectric isolation structure within a conductive layer of said integrated circuit chip, said plurality of discrete conductors in the dielectric layer comprising discrete horizontally oriented conductors within said conductive layer of said integrated circuit chip.

9. The method of claim 1, wherein said method comprises forming a plurality of said dielectric layer structures in said integrated circuit chip, each layer containing a respective plurality of said voids.

10. The method of claim 1, wherein said step of patterning said dielectric is performed before said step of removing said cylindrical form structures.

11. The method of claim 1, wherein said step of patterning said dielectric is performed after said step of removing said cylindrical form structures.

12. The method of claim 1, wherein said step of lining vertical walls of each said recess with a conformal film dielectric comprises:
depositing a conformal film in each said recess; and
subjecting said conformal film to a directional reactive ion etch to remove said film from horizontal surfaces while leaving said film on vertical surfaces.

13. A method of forming a dielectric layer within an integrated circuit chip, comprising the steps of:
forming a plurality of carbon nanotubes on a surface of said integrated circuit chip;
depositing a layer of dielectric over said surface of said integrated circuit chip to surround said carbon nanotubes;
planing said layer of dielectric and carbon nanotubes together to form a level surface of said dielectric; and
removing said carbon nanotubes to create said dielectric layer structure, said dielectric layer structure having voids therein, said removing said carbon nanotubes step being performed after said step of planing said layer of dielectric and carbon nanotubes together.

14. The method of claim 13, wherein said step of forming a plurality of carbon nanotubes on a surface of said integrated chip comprises:
forming a plurality of catalyst particles on said surface of said integrated circuit chip; and
growing said plurality of carbon nanotubes in a substantially perpendicular orientation from said plurality of catalyst particles.

15. The method of claim 14, wherein said step of forming a plurality of catalyst particles on said surface of said integrated circuit chip comprises:
depositing a metallic base film for said catalyst particles; and
processing said integrated circuit chip having deposited therein said metallic base film in an electrolyte solution to deposit catalyst particles by pulse-current electrochemical deposition.

16. The method of claim 14, wherein said step of forming a plurality of catalyst particles on said surface of said integrated circuit chip comprises:
depositing a monolayer of polystyrene beads on said surface of said integrated circuit chip;
sputter depositing said catalyst onto said surface of said integrated circuit chip through spaces in said polystyrene beads; and
removing said monolayer of polystyrene beads.

17. The method of claim 14, wherein said step of forming a plurality of catalyst particles on said surface of said integrated circuit chip comprises:
depositing a film of a catalyst material on said surface of said integrated circuit chip; and
lithographically defining a pattern of discrete catalyst particles in said film.

18. A method of making an integrated circuit chip, comprising the steps of:
providing a chip substrate having a plurality of active devices formed therein;
forming a plurality of carbon nanotubes on a surface of said integrated circuit chip;
depositing a layer of dielectric over said surface of said integrated circuit chip to surround said cylindrical form structures;
planing said layer of dielectric and carbon nanotubes together to form a level surface of said dielectric;
removing said carbon nanotubes to create a dielectric layer structure having voids therein, said removing said carbon nanotubes step being performed after said step of planing said layer of dielectric and carbon nanotubes together;
forming a plurality of cavities in said dielectric layer structure, each cavity corresponding to a respective location for a discrete conductor;
lining vertical walls of each said cavity with a conformal film dielectric to seal said voids from conductive material; and
depositing a conductive material into said cavities after performing said steps of forming a plurality of cavities and lining vertical walls of each said cavity to form said plurality of discrete conductors in said dielectric layer structure.

19. The method of claim 18, wherein said step of forming a plurality of carbon nanotubes on a surface of said integrated chip comprises:

forming a plurality of catalyst particles on said surface of said integrated circuit chip; and growing said plurality of carbon nanotubes in the presence of an electric field to induce an orientation of said carbon nanotubes substantially perpendicular to said surface.

20. The method of claim 19, wherein said step of forming a plurality of catalyst particles on said surface of said integrated circuit chip comprises:

depositing a metallic base film for said catalyst particles; and processing said integrated circuit chip having deposited therein said metallic base film in an electrolyte solution to deposit catalyst particles by pulse-current electrochemical deposition.

21. The method of claim 19, wherein said step of forming a plurality of catalyst particles on said surface of said integrated circuit chip comprises:

depositing a monolayer of polystyrene beads on said surface of said integrated circuit chip;

sputter depositing said catalyst onto said surface of said integrated circuit chip through spaces in said polystyrene beads; and removing said monolayer of polystyrene beads.

22. The method of claim 19, wherein said step of forming a plurality of catalyst particles on said surface of said integrated circuit chip comprises:

depositing a film of a catalyst material on said surface of said integrated circuit chip; and lithographically defining a pattern of discrete catalyst particles in said film.

23. The method of claim 19, wherein said step of lining vertical walls of each said recess with a conformal film dielectric comprises:

depositing a conformal film in each said recess; and subjecting said conformal film to a directional reactive ion etch to remove said film from horizontal surfaces while leaving said film on vertical surfaces.

* * * * *